United States Patent
Ikuta et al.

(10) Patent No.: US 10,677,648 B2
(45) Date of Patent: Jun. 9, 2020

(54) OPTICAL SENSOR AND ELECTRONIC DEVICE

(71) Applicant: SHARP KABUSHIKI KAISHA, Sakai, Osaka (JP)

(72) Inventors: Yoshiki Ikuta, Sakai (JP); Takuma Hiramatsu, Sakai (JP); Takayuki Shimizu, Sakai (JP); Hideki Sato, Sakai (JP)

(73) Assignee: SHARP KABUSHIKI KAISHA, Sakai, Osaka (JP)

( * ) Notice: Subject to any disclaimer, the term of this patent is extended or adjusted under 35 U.S.C. 154(b) by 0 days.

(21) Appl. No.: 16/330,957

(22) PCT Filed: Jun. 2, 2017

(86) PCT No.: PCT/JP2017/020678
§ 371 (c)(1),
(2) Date: Mar. 6, 2019

(87) PCT Pub. No.: WO2018/047424
PCT Pub. Date: Mar. 15, 2018

(65) Prior Publication Data
US 2019/0257689 A1 Aug. 22, 2019

(30) Foreign Application Priority Data

Sep. 8, 2016 (JP) .................................. 2016-175763

(51) Int. Cl.
*G01J 1/42* (2006.01)
*G01S 17/10* (2020.01)
(Continued)

(52) U.S. Cl.
CPC ................. *G01J 1/42* (2013.01); *G01S 17/10* (2013.01); *H01L 31/10* (2013.01); *H01L 31/107* (2013.01); *H01L 31/12* (2013.01)

(58) Field of Classification Search
CPC .. G01J 1/42; G01S 17/10; G01S 17/14; G01S 7/4861; G01S 7/4865; H01L 31/10; H01L 31/107; H01L 31/12
See application file for complete search history.

(56) References Cited

U.S. PATENT DOCUMENTS

| 6,208,701 B1 * | 3/2001 | Hiramatsu | H04L 7/0054 375/354 |
| 2007/0263202 A1 * | 11/2007 | Ohtomo | G01C 3/08 356/4.01 |

(Continued)

FOREIGN PATENT DOCUMENTS

JP 2012-060012 A 3/2012

*Primary Examiner* — Marcus H Taningco
(74) *Attorney, Agent, or Firm* — ScienBiziP, P.C.

(57) ABSTRACT

Whether an optical delay on a space optical path is within a light emission cycle is accurately determined without narrowing a range of a measurable distance in the light emission cycle. A DFF 1 that divides an output pulse of a first DLL (121) by two to provide a first time offset and a DFF 2 that divides an output pulse of a second DLL (122) by two to provide a second time offset are included, and at least following mathematical formulas (1) and (2) are satisfied:

$$O1 = m \cdot T\tfrac{1}{2} \qquad (1)$$

$$0 < O1 < (N-1) \cdot T1 \qquad (2)$$

(where, $m \geq 1$),
when a time corresponding to a difference between the first time offset and the second time offset is O1 and the first cycle is T1.

10 Claims, 16 Drawing Sheets

(51) Int. Cl.
  *H01L 31/107*   (2006.01)
  *H01L 31/12*   (2006.01)
  *H01L 31/10*   (2006.01)

(56) References Cited

U.S. PATENT DOCUMENTS

| | | | |
|---|---|---|---|
| 2012/0075615 A1* | 3/2012 | Niclass | G01S 17/89 |
| | | | 356/5.01 |
| 2013/0077082 A1* | 3/2013 | Mellot | G01S 17/36 |
| | | | 356/4.01 |
| 2014/0231631 A1 | 8/2014 | Moore et al. | |
| 2016/0047904 A1* | 2/2016 | Mellot | G01S 17/10 |
| | | | 356/5.03 |

* cited by examiner

OPTICAL SENSOR AND ELECTRONIC DEVICE

TECHNICAL FIELD

The present invention relates to an optical sensor and an electronic device.

BACKGROUND ART

In optical communication or measurement of a time of flight (TOF), an avalanche photodiode utilizing an avalanche amplification (avalanche) effect of a photodiode has been conventionally used as a light receiving element that detects weak light at high speed (for example, refer to PTL 1). When a reverse bias voltage less than a breakdown voltage is applied, the avalanche photodiode operates in a linear mode and an output current varies so as to have a positive correlation with a light receiving amount. On the other hand, when a reverse bias voltage equal to or more than the breakdown voltage is applied, the avalanche photodiode operates in a Geiger mode. The avalanche photodiode in the Geiger mode causes an avalanche phenomenon even in a case of incidence of a single photon, so that a large output current is obtained. Thus, the avalanche photodiode in the Geiger mode is called a single photon avalanche diode (SPAD).

When a quenching resistance is applied in series to the avalanche photodiode in the Geiger mode, a binary pulse output is able to be obtained. Such a circuit is constituted by, for example, a photodiode, an active quenching resistance (resistance component of a MOS transistor), and a buffer.

The aforementioned photodiode is an avalanche photodiode in the Geiger mode, and, when being applied with the bias voltage equal to or greater than the breakdown voltage, causes an avalanche phenomenon for incidence of a single photon, so that a current flows. When the current flows through the aforementioned active quenching resistance connected in series to the photodiode, a voltage between terminals of the active quenching resistance increases, and the bias voltage of the photodiode drops accordingly, so that the avalanche phenomenon stops. When there is no current by the avalanche phenomenon, the voltage between the terminals of the active quenching resistance decreases, and the photodiode returns to a state of being applied with the bias voltage equal to or greater than the breakdown voltage again. By the aforementioned buffer, the change of the voltage between the photodiode and the active quenching resistance is extracted as a binary pulse output.

Moreover, PTL 2 discloses a method of measuring a distance in such a manner that reflection light and direct light from a light emitting element are input to different delay locked loop circuits (DLLs) with use of the aforementioned SPAD and a delay amount between outputs of the two DLLs is converted into a digital value.

CITATION LIST

Patent Literature

PTL 1: Japanese Unexamined Patent Application Publication No. 2012-060012 (published on Mar. 22, 2012)

PTL 2: U.S. Patent Application Publication No. US2014/0231631 (published on Aug. 21, 2014)

SUMMARY OF INVENTION

Technical Problem

However, in the method described in PTL 2, in a case where a distance between a detection object and an optical sensor (a first light receiving unit, a second light receiving unit, or the light emitting element) is almost zero and a delay signal varies for each cycle, a value considerably greater than almost zero is output. FIG. 4 is a graph illustrating a relationship between a detection object distance (horizontal axis) indicating a distance between the detection object and the optical sensor and a measured distance (vertical axis) that is a result of measuring the distance. Specifically, in FIG. 4, in a case where the detection object distance is 0 or almost 0, the measured distance is remarkably increased to be more than 0. When a delay output created from the first light receiving unit is DLL_PULSE, a delay output created from the second light receiving unit is DLL2_PULSE, and a delay difference is SD_PULSE, as illustrated in FIG. 5, the SD_PULSE generates a value near a maximum value due to jitter of a reference output or jitter of a DLL output pulse, and averaging is performed with the value included, so that the remarkable increase is caused. FIG. 5 is a timing chart of the DLL1_PULSE, the DLL2_PULSE, and the SD_PULSE including jitter according to a related art. Additionally, also in a case where a light emission cycle of the light emitting element is close to a delay of reflection light by the detection object, averaging is performed with a measurement value in another cycle included, so that a value smaller than an ideal maximum measurement value is output. Due to such characteristics, a straight-line part in a region 1 of FIG. 4 becomes narrow particularly when variation is great, so that a measurable distance also becomes short.

Additionally, for example, when a value of A in FIG. 4 is output as a measured distance, it is difficult to determine whether the detection object distance such as a1 of the region 1 or a2 of a region 2 belongs to the region 1, the region 2, or a region thereafter. Thus, it is necessary that measurement is performed in two cycles as in FIG. 6, and a part where there is no difference of an output of the measured distance is used, for example, to uniquely decide the detection object distance a1 corresponding to the measured distance A. However, for example, a value of a measured distance B in FIG. 6 gently changes due to switching of the cycle, so that it is difficult to discriminate b1 and b2.

As described above, the method disclosed in PTL 2 causes a problem that a range of the measurable distance in the light emission cycle becomes narrow so that it is difficult to accurately determine whether an optical delay on a space optical path is within the light emission cycle.

The invention is made in view of the aforementioned problem and an object thereof is to provide an optical sensor and an electronic device that enable to accurately determine whether an optical delay on a space optical path is within a light emission cycle without narrowing a range of a measurable distance in the light emission cycle.

Solution to Problem

In order to solve the aforementioned problem, an optical sensor according to an aspect of the invention includes at least: a light emitting element that is driven in a first cycle; a first light receiving unit of a photon-count type that outputs a pulse according to incidence of signal light to be measured;

a second light receiving unit of a photon-count type that outputs a pulse according to incidence of reference light indicating a time reference; and a time difference extraction circuit that extracts a time difference between the output pulse from the first light receiving unit and the output pulse from the second light receiving unit, in which the time difference extraction circuit includes a first DLL to which the output pulse from the first light receiving unit is input, a second DLL to which the output pulse from the second light receiving unit is input, a first waveform generation unit that divides the output pulse of the first DLL by N (N≥2) to provide a first time offset, and a second waveform generation unit that divides the output pulse of the second DLL by N to provide a second time offset, and at least following mathematical formulas (1) and (2) are satisfied:

$$O1 = m \cdot T\tfrac{1}{2} \quad (1)$$

$$0 < O1 < (N-1) \cdot T1 \quad (2)$$

(where, m≥1),
when a time corresponding to a difference between the first time offset and the second time offset is O1 and the first cycle is T1.

In order to solve the aforementioned problem, an optical sensor according to another aspect of the invention includes at least: a light emitting element that is driven in a first cycle; a first light receiving unit of a photon-count type that outputs a pulse according to incidence of signal light to be measured; a second light receiving unit of a photon-count type that outputs a pulse according to incidence of reference light indicating a time reference; and a time difference extraction circuit that extracts a time difference between the output pulse from the first light receiving unit and the output pulse from the second light receiving unit, in which the time difference extraction circuit includes a first DLL to which the output pulse from the first light receiving unit is input, a second DLL to which the output pulse from the second light receiving unit is input, a first waveform generation unit that divides the output pulse of the first DLL by N (N≥2), and a second waveform generation unit that divides the output pulse of the second DLL by N, the first waveform generation unit provides a time offset to the output pulse of the first DLL or the second waveform generation unit provides a time offset to the output pulse of the second DLL, and at least following mathematical formulas (1) and (2) are satisfied:

$$O1 = m \cdot T\tfrac{1}{2} \quad (1)$$

$$0 < O1 < (N-1) \cdot T1 \quad (2)$$

(where, m≥1),
when a time corresponding to the time offset is O1 and the first cycle is T1.

In order to solve the aforementioned problem, an electronic device according to an aspect of the invention includes the optical sensor.

Advantageous Effects of Invention

According to each aspect of the invention, whether an optical delay on a space optical path is within a light emission cycle is able to be accurately determined without narrowing a range of a measurable distance in the light emission cycle.

DESCRIPTION OF EMBODIMENTS

Embodiments of the invention will be described below. Note that, for convenience of description, a member having the same function as that of a member described before will be given the same reference sign and description thereof will be omitted.

Embodiment 1

An embodiment of the invention will be described in detail below.

Figure 1:
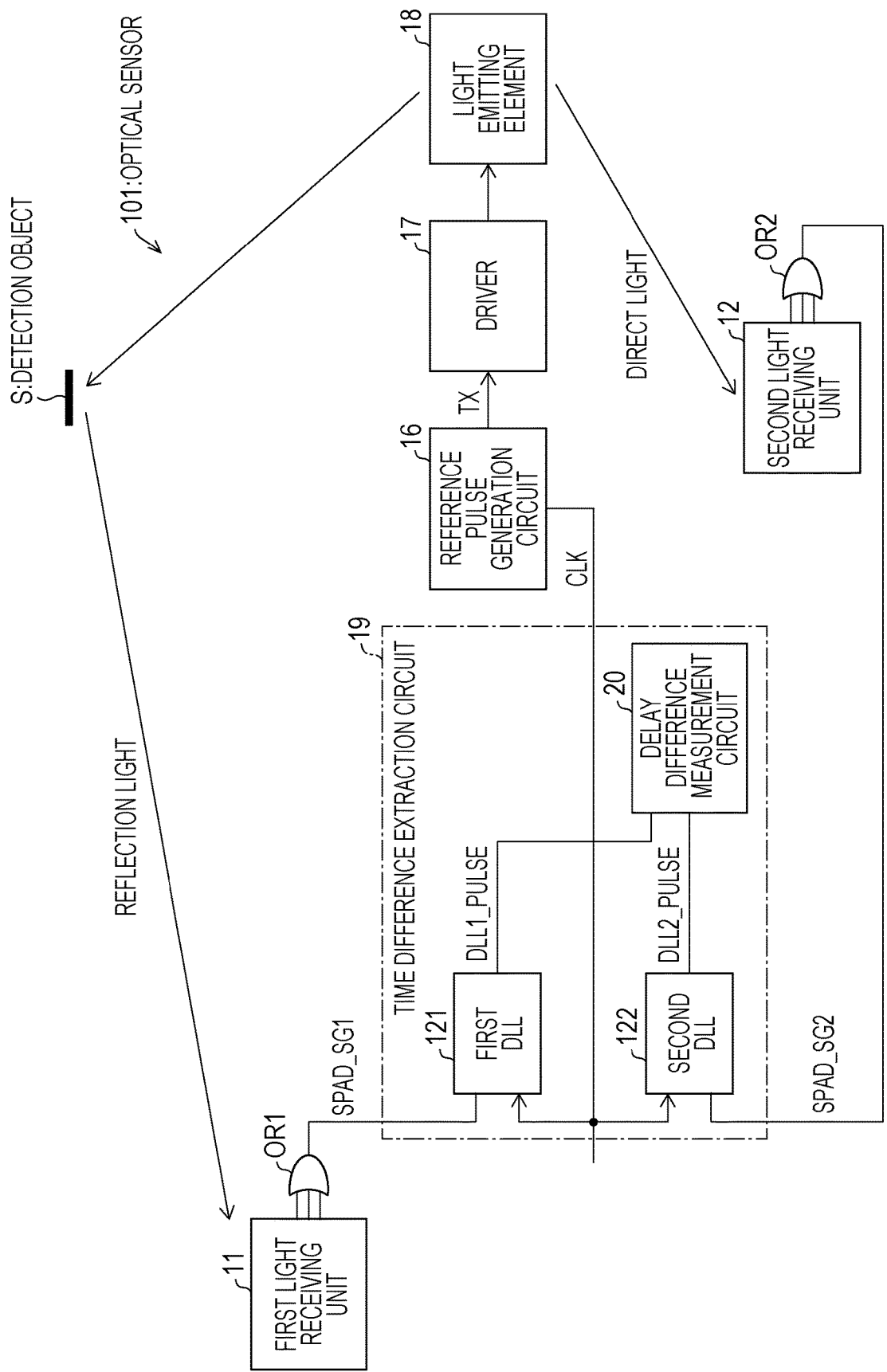
FIG. 1 is a block diagram of an optical sensor according to Embodiment 1 of the invention.

FIG. 1 is a block diagram illustrating a schematic configuration of an optical sensor 101 according to the present embodiment.

As illustrated in FIG. 1, the optical sensor 101 includes a light emitting element 18, a first light receiving unit 11, and a second light receiving unit 12. The light emitting element 18 is driven in a first cycle T1. The first light receiving unit 11 is a photon-count light receiving unit that outputs a pulse according to incidence of reflection light (signal light to be measured) from a detection object S. The second light receiving unit 12 is a photon-count light receiving unit that outputs a pulse according to incidence of direct light (reference light indicating a time reference) from the light emitting element 18.

As illustrated in FIG. 1, the optical sensor 101 also includes a reference pulse generation circuit 16 that provides a driver 17 (driver circuit) with a reference pulse and provides a time difference extraction circuit 19 with a reference clock, the driver (driver circuit) 17 that drives the light emitting element 18 on the basis of the reference pulse, and the time difference extraction circuit 19 that extracts a time difference between a pulse output from the first light receiving element 11 and a pulse output from the second light receiving unit 12. The time difference extraction circuit 19 includes a first DLL 121, a second DLL 122, and a delay difference measurement circuit 20.

In the optical sensor 101, pulse light is radiated from the light emitting element 18, and when reflection light from the detection object S is incident on the first light receiving unit 11 and direct light from the light emitting element 18 is incident on the second light receiving unit 12, the output pulse from the first light receiving unit 11 and the output pulse from the second light receiving unit 12 are input, to an input stage of the time difference extraction circuit 19, at a frequency according to an amount of light and with a time difference according to a difference of distances on a space optical path. A distance on the space optical path according to the output pulse from the second light receiving unit 12 is able to be regarded as being almost 0. By using the output pulse from the first light receiving unit 11, the output pulse from the second light receiving unit 12, and the reference clock, the time difference extraction circuit 19 extracts a time difference between the output pulse from the first light receiving unit 11 and the output pulse from the second light receiving unit 12, and is thus able to extract the time difference corresponding to the distance on the space optical path and obtain a distance to the detection object S.

Figure 2:
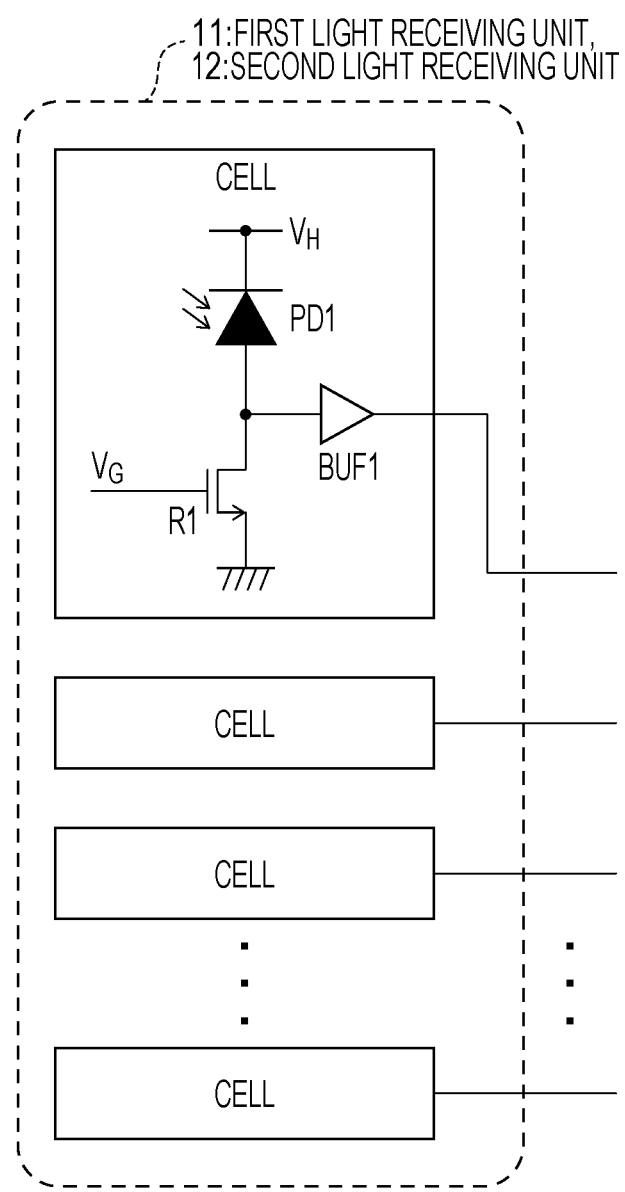
FIG. 2 is a block diagram of a first light receiving unit and a second light receiving unit that constitute the optical sensor illustrated in FIG. 1.

FIG. 2 is a circuit diagram illustrating a schematic configuration of the first light receiving unit 11 and the second light receiving unit 12. Here, since configurations of the first light receiving unit 11 and the second light receiving unit 12 are the same, description will be given by taking the first light receiving unit 11 as an example. As illustrated in FIG. 2, the first light receiving unit 11 has a plurality of cells each of which is constituted by a photodiode PD1, an active quenching resistance R1 (resistance component of a MOS transistor), and a buffer BUF1. The photodiode PD1 is an avalanche photodiode in a Geiger mode and has an incident light amount extracted as a binary pulse output by the active quenching resistance R1 and the buffer BUF1. The output pulse of the first light receiving unit 11 is subjected to an OR operation by an OR circuit OR1 (refer to FIG. 1) and supplied to the first DLL 121 of the time difference extraction circuit 19. The output pulse of the second light receiving unit 12 is subjected to an OR operation by an OR circuit OR2 (refer to FIG. 1) and supplied to the second DLL 122 of the time difference extraction circuit 19.

Figure 3:
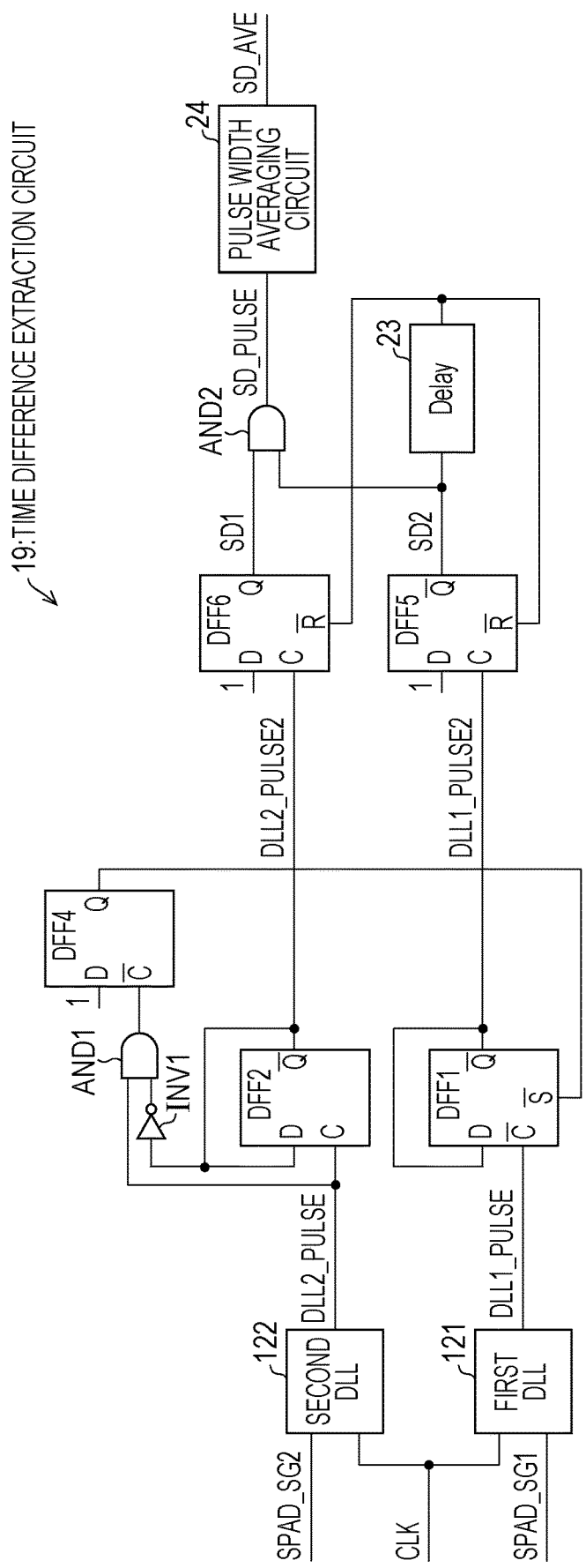
FIG. 3 is a block diagram illustrating a time difference extraction circuit that constitutes the optical sensor illustrated in FIG. 1.
Figure 4:
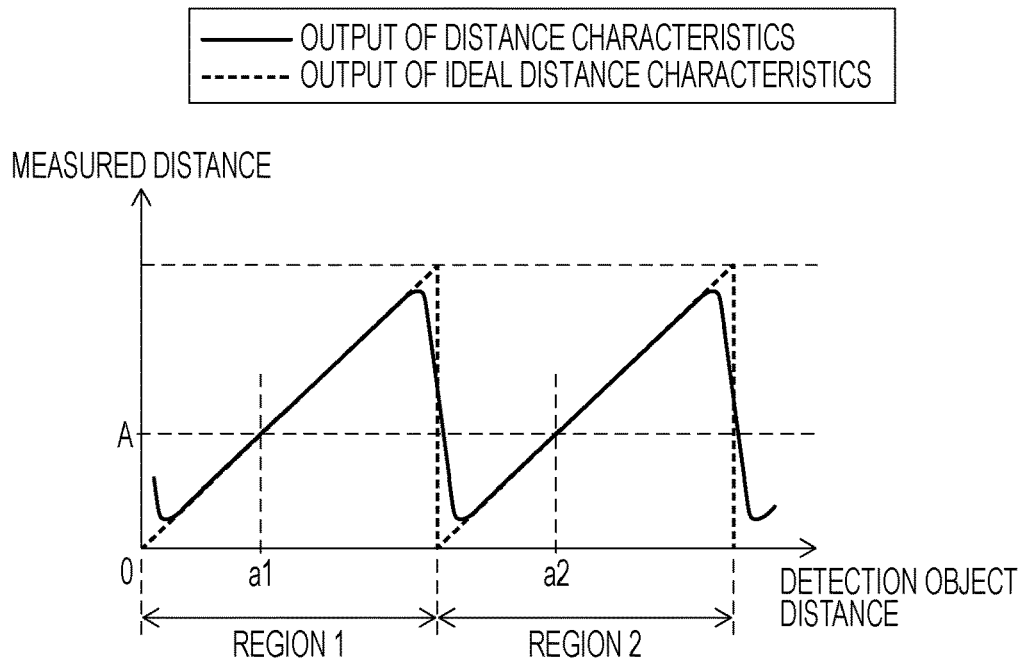
FIG. 4 is a graph illustrating characteristics of a relationship between a detection object distance and a measured distance according to a related art.
Figure 5:
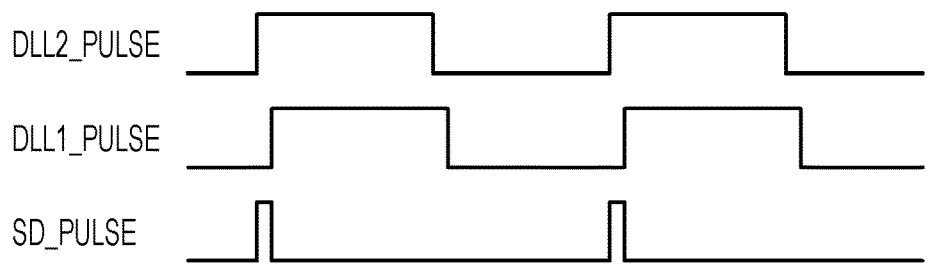
FIG. 5 is a graph illustrating an example of SD_PULSE in which jitter exists according to a related art.
Figure 5:
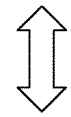
Figure 5:
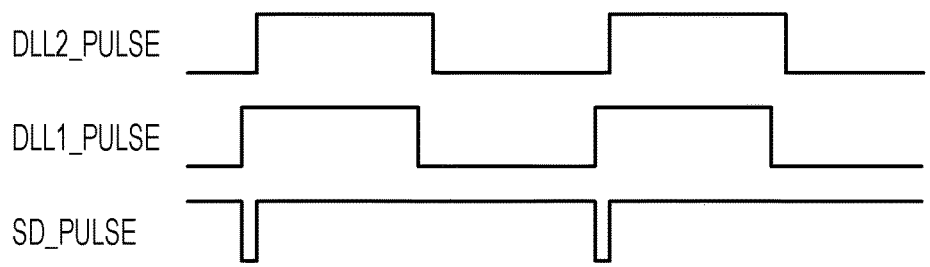

FIG. 3 is a circuit diagram illustrating a schematic configuration of the time difference extraction circuit 19. The time difference extraction circuit 19 includes the first DLL 121, the second DLL 122, a DFF (D-flip flop) 1, a DFF 2, an inverter INV1, an AND circuit AND1, a DFF 4, a DFF 5, a DFF 6, an AND circuit AND2, a Delay 23 that slightly delays an input signal for the purpose of resetting the DFF 5 and the DFF 6, and a pulse width averaging circuit (averaging circuit) 24. The DFF 1 corresponds to a first waveform generation unit and the DFF 2 corresponds to a second waveform generation unit.

A signal (output pulse from the first light receiving unit) SPAD_SG1 created from the first light receiving unit 11 through the OR circuit OR1 is input to the first DLL 121 and a signal (output pulse of the first DLL) DLL1_PULSE in which rising timing of a CLK (reference clock) obtained from the reference pulse generation circuit 16 is delayed to a center of a region where the SPAR_SG1 is generated is created. Moreover, a signal (output pulse from the second light receiving unit) SPAD_SG2 created from the second light receiving unit 12 through the OR circuit OR2 is input to the second DLL 122 and a signal (output pulse of the second DLL) DLL2_PULSE in which the rising timing of the CLK (reference clock) obtained from the reference pulse generation circuit 16 is delayed to a center of a region where SPAD_SG2 is generated is created.

Figure 7:
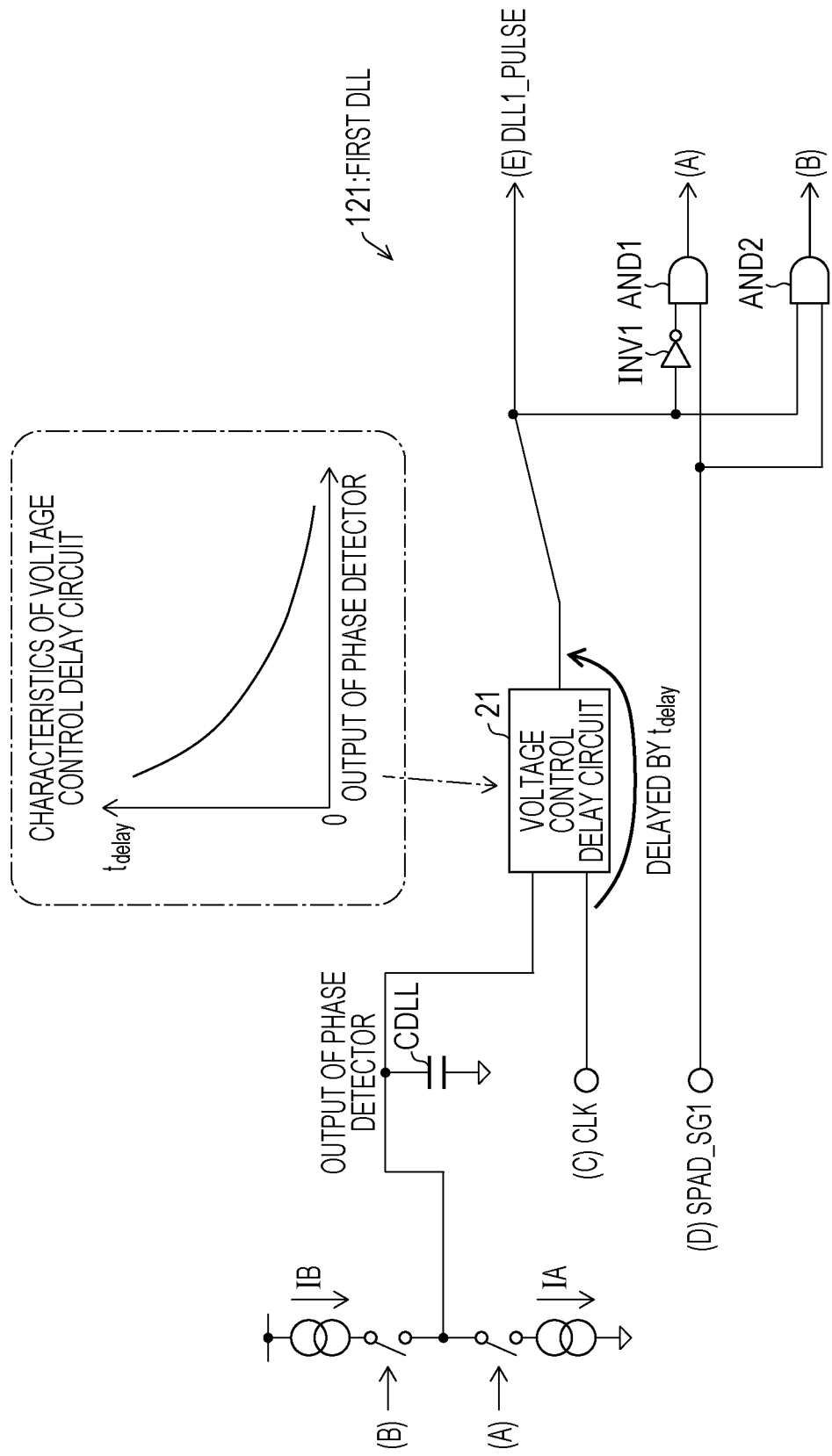
FIG. 7 is a block diagram of a first DLL that constitutes the optical sensor illustrated in FIG. 1.

FIG. 7 is a circuit diagram illustrating a schematic configuration of the first DLL 121. Here, since configurations of the first DLL 121 and the second DLL 122 are the same, description will be given by taking the first DLL 121 as an example. The first DLL 121 has a phase detector (not illustrated), a voltage control delay circuit 21, and a capacitance element CDLL that holds a control voltage of the voltage control delay circuit 21, and is configured in such a manner that the capacitance element CDLL is charged at a fixed value in a first period, a clock obtained by dividing the reference clock of the voltage control delay circuit 21 by four and a four-division output of the voltage control delay circuit 21 are input to the phase detector in a second period, and the pulse from the first light receiving unit 11 and a clock obtained by dividing the output of the voltage control delay circuit 21 by two are input to the phase detector in a third period.

Figure 8:
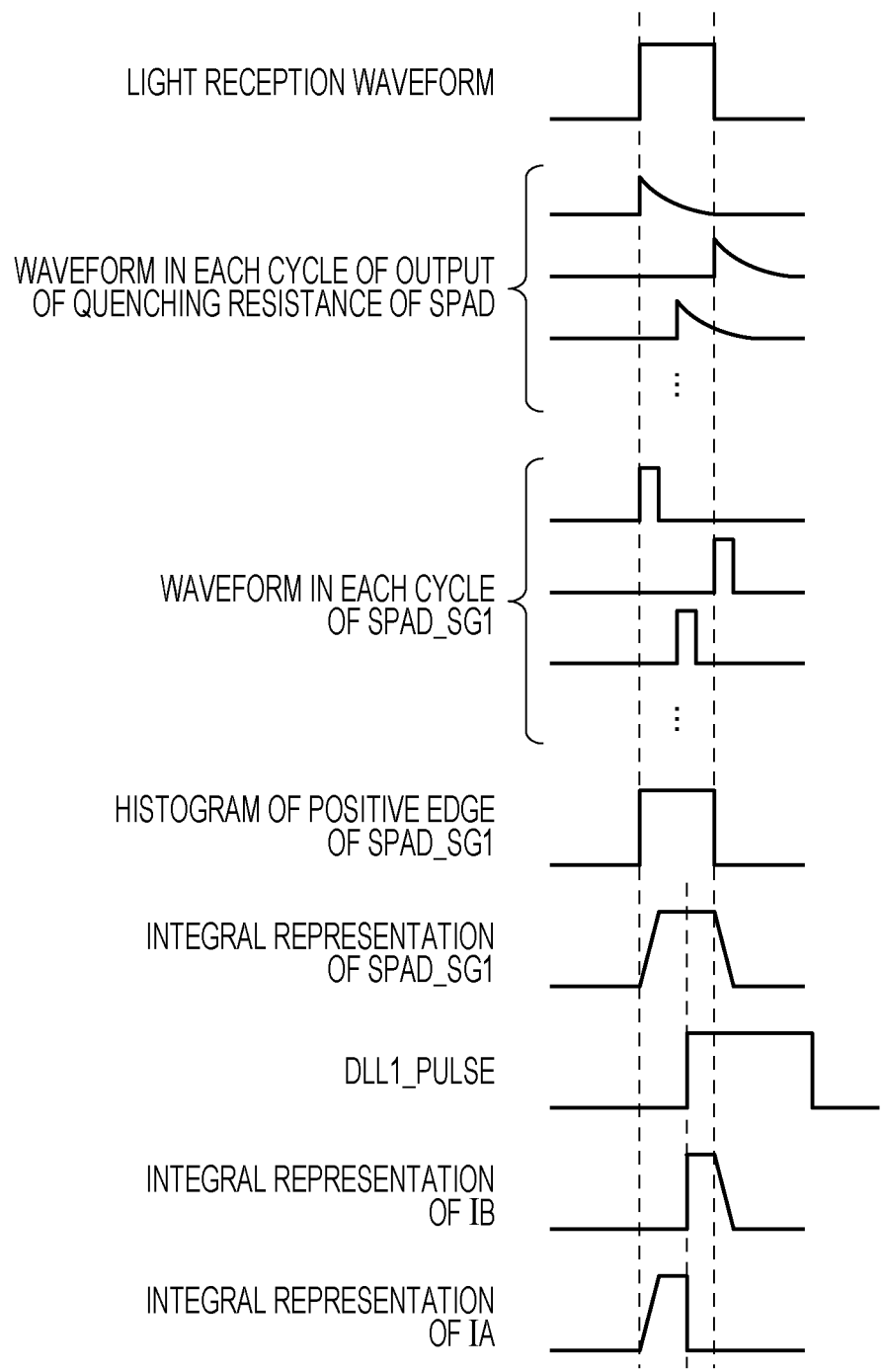
FIG. 8 illustrates a relationship between a light reception waveform and a DLL waveform.

Specifically, the first DLL 121 includes the capacitance CDLL, the voltage control delay circuit 21, the inverter INV1, the AND circuit AND1, and the AND circuit AND2, and in a case where the signal SPAD_SG1 randomly generated in a light receiving range is generated when a signal indicated by (E) is high (1), a signal indicated by (B) becomes high and the capacitance CDLL is charged at a current IB. Moreover, in a case where the signal SPAD_SG1 randomly generated in the light receiving range is generated when the signal indicated by (E) is low (0), a signal indicated by (A) becomes high and the capacitance CDLL is discharged at a current IA. When such an operation is performed for a sufficient period, the signal DLL1_PULSE in which the reference clock CLK is delayed to the center of the region where the signal SPAD_SG1 is generated is output from a terminal to which the signal indicated by (E) is supplied. FIG. 8 illustrates a state of a waveform when the first DLL 121 is converged. It is indicated that the waveform is stabilized in such a state because an integrated value of the current IB and an integrated value of the current IA match when a rising edge of the signal DLL1_PULSE is at a center of a waveform (integral representation of the SPAD_SG1) obtained by integrating the signal SPAD_SG1, which is generated randomly in each cycle in a range of a waveform (light reception waveform) when the first light receiving unit 11 receives light, over all cycles. A configuration and an operation principle of the second DLL 122 are also equivalent to a configuration and an operation principle of the first DLL 121.

When the signal DLL1_PULSE is input to the DFF 1, the DFF 1 creates a signal DLL1_PULSE2 that is divided by two (divided by N). Here, by a negative edge trigger, the DFF 1 provides an offset to a time corresponding to ½ of a first cycle T1 that is a light emission cycle of the light emitting element 18. When the signal DLL2_PULSE is input to the DFF 2, the DFF 2 creates a signal DLL2_PULSE2 that is divided by two (divided by N). By setting an output of the DFF 4 to high in first falling of the signal DLL2_PULSE, start of the negative edge trigger of the DFF 1, which is a condition to generate the signal DLL1_PULSE2, is delayed from rising of the signal DLL2_PULSE by a time corresponding to ½ of the first cycle T1. It is assumed that the delay provided by the DFF 1 is a first time offset. It is also assumed that a delay of the signal DLL2_PULSE2 from rising of the signal DLL2_PULSE, which is provided by the DFF 2, is a second time offset, and the second time offset is 0 cycle of the first cycle T1 in the time difference extraction circuit 19. By inputting the signals DLL2_PULSE2 and DLL1_PULSE2 to components of the DFF 5, the DFF 6, the AND circuit AND2, and the Delay 23, rising of the signal DLL2_PULSE2 becomes rising of the SD_PULSE (output time difference of the first waveform generation unit and the second waveform generation unit), and falling of the signal DLL1_PULSE2 becomes falling of the SD_PULSE. The SD_PULSE is input to the pulse width averaging circuit 24 and is averaged for a certain period, and a value SD_AVE (output value of the averaging circuit) obtained, for example, by digitizing the resultant is output. An extraction unit (not illustrated) that corrects the value SD_AVE on the basis of the first time offset and the second time offset which are described above and extracts a digitized value of a time difference between the signal SPAD_SG1 and the signal SPAD_SG2 is provided, and when correction for subtracting a digitized value of the first time offset corresponding to ½ of the first cycle T1 from the value SD_AVE is performed by the extraction unit, a delay time RANGE according to a distance on the space optical path is able to be obtained.

Figure 9:
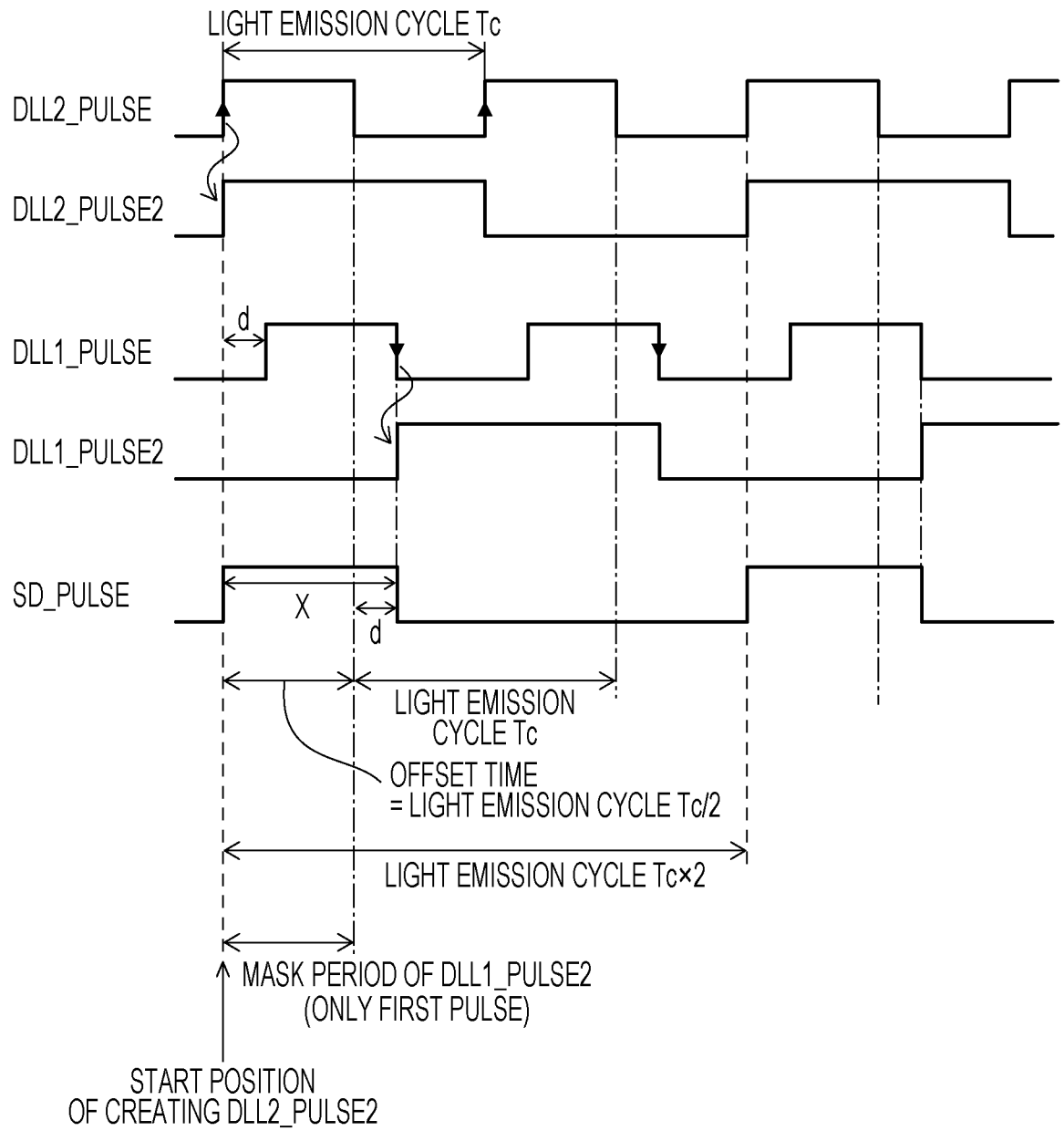
FIG. 9 illustrates a relationship between a light reception waveform and a DLL waveform.

FIG. 9 illustrates an example of a waveform when there is a time difference d between the signal DLL2_PULSE and the signal DLL1_PULSE in the configuration of the time difference extraction circuit 19. A time X obtained by adding the time difference d and the time offset (½ of the first cycle T1) appears as a pulse width of the SD_PULSE. Since the signal DLL1_PULSE and the signal DLL2_PULSE are iterated in a light emission cycle Tc (that is, first cycle T1), a range of the time difference between the signal DLL1_PULSE and the signal DLL2_PULSE falls in a range of 0 to the light emission cycle Tc. Here, since a certain amount of jitter exists in the SD_PULSE, for example, when the time difference d is near 0, the time difference between the signal DLL1_PULSE and the signal DLL2_PULSE may fall in a region near the light emission cycle Tc over the range of 0 or less. According to the configuration of the time difference extraction circuit 19, however, a continuous region is expanded to be twice as wide as the light emission cycle Tc by dividing the signals DLL1_PULSE and DLL2_PULSE, so that there is no problem even when the time difference d is minus, and no adverse influence is exerted on the averaging by the pulse width averaging circuit 24.

Figure 10:
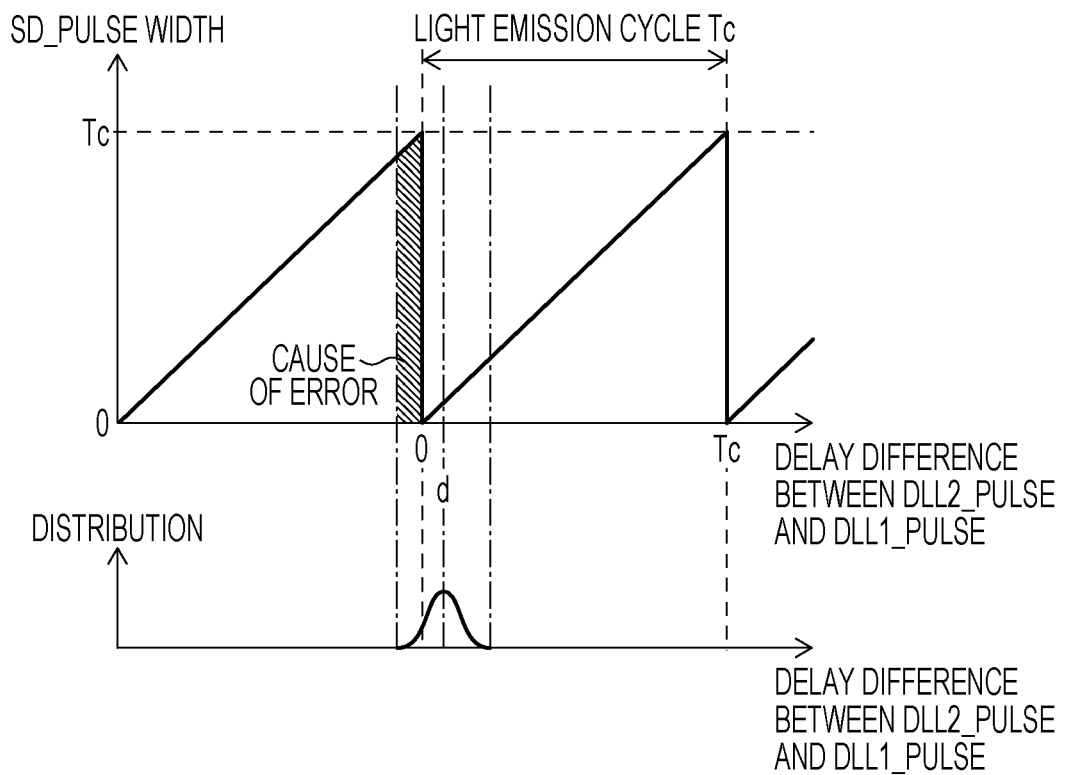
FIG. 10 is a graph illustrating characteristics of an output with respect to a DLL delay difference according to a related art.

FIG. 10 illustrates characteristics of an SD_PULSE width with respect to a delay difference between the signal DLL1_PULSE and the signal DLL2_PULSE when the signal DLL1_PULSE or the signal DLL2_PULSE is not divided. It is indicated that, in a case where the characteristics have a range of distribution in the figure with the time difference d corresponding to the delay difference as a center, the characteristics of a preceding cycle are provided due to a foot of the distribution being 0 or less, and a value close to a time (hereinafter, referred to as a "time Tc") after one cycle of the light emission cycle Tc has passed from a reference time exists, so that an error is caused in the averaging.

Figure 11:
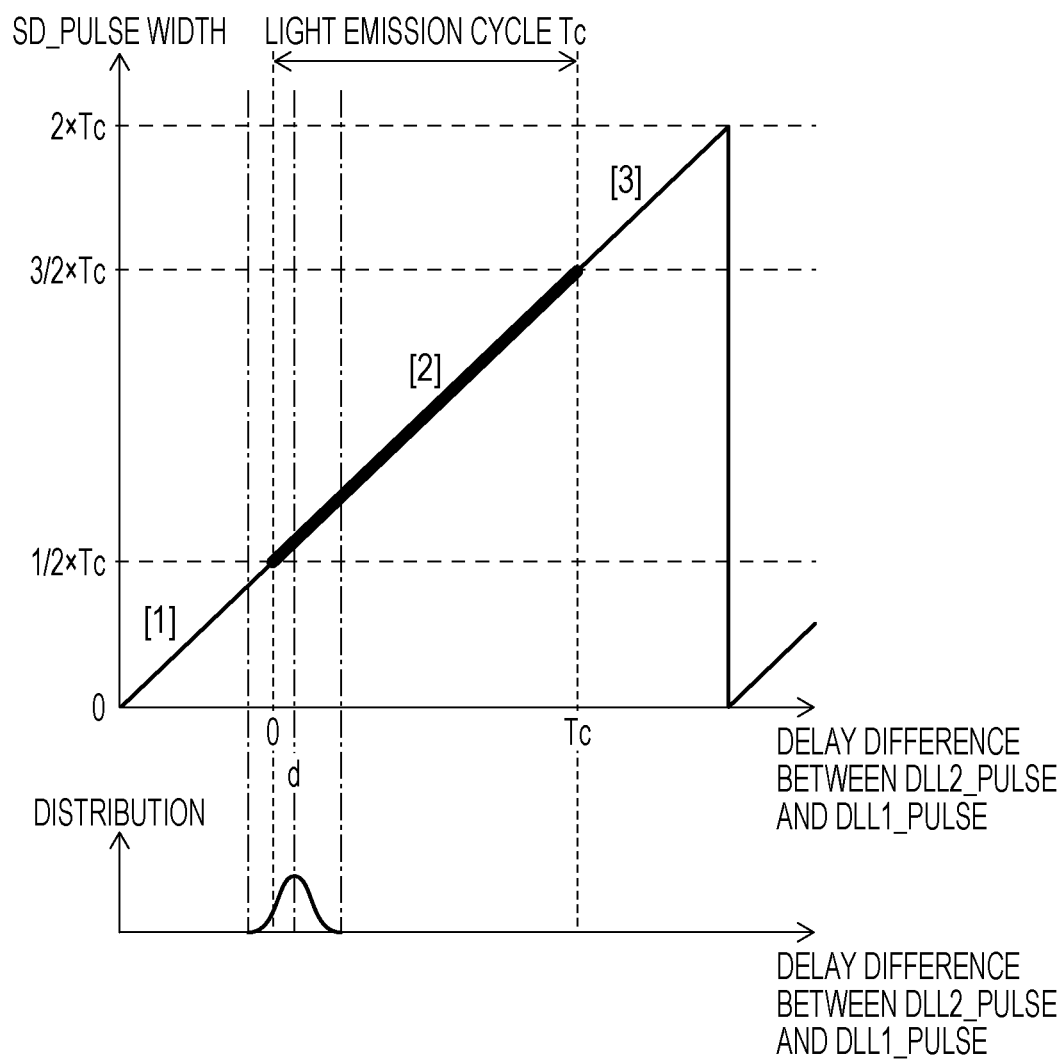
FIG. 11 is a graph illustrating characteristics of an output with respect to a DLL delay difference of the time difference extraction circuit illustrated in FIG. 3.

FIG. 11 illustrates characteristics of the SD_PULSE width with respect to a delay difference between the signal DLL1_PULSE and the signal DLL2_PULSE, when the signal DLL1_PULSE and the signal DLL2_PULSE are divided by two. In a case where the characteristics have a range of distribution in the figure with the time difference d corresponding to the delay difference as a center, even when a foot of the distribution is 0 or less (region of [1]), the characteristics are continuously linear from a region of [2], so that the averaging is able to be normally performed. Also in a case where the distribution is near the time Tc, the characteristics are continuously linear from the region of [2] to a region of [3], so that the averaging is able to be normally performed.

Figure 13:
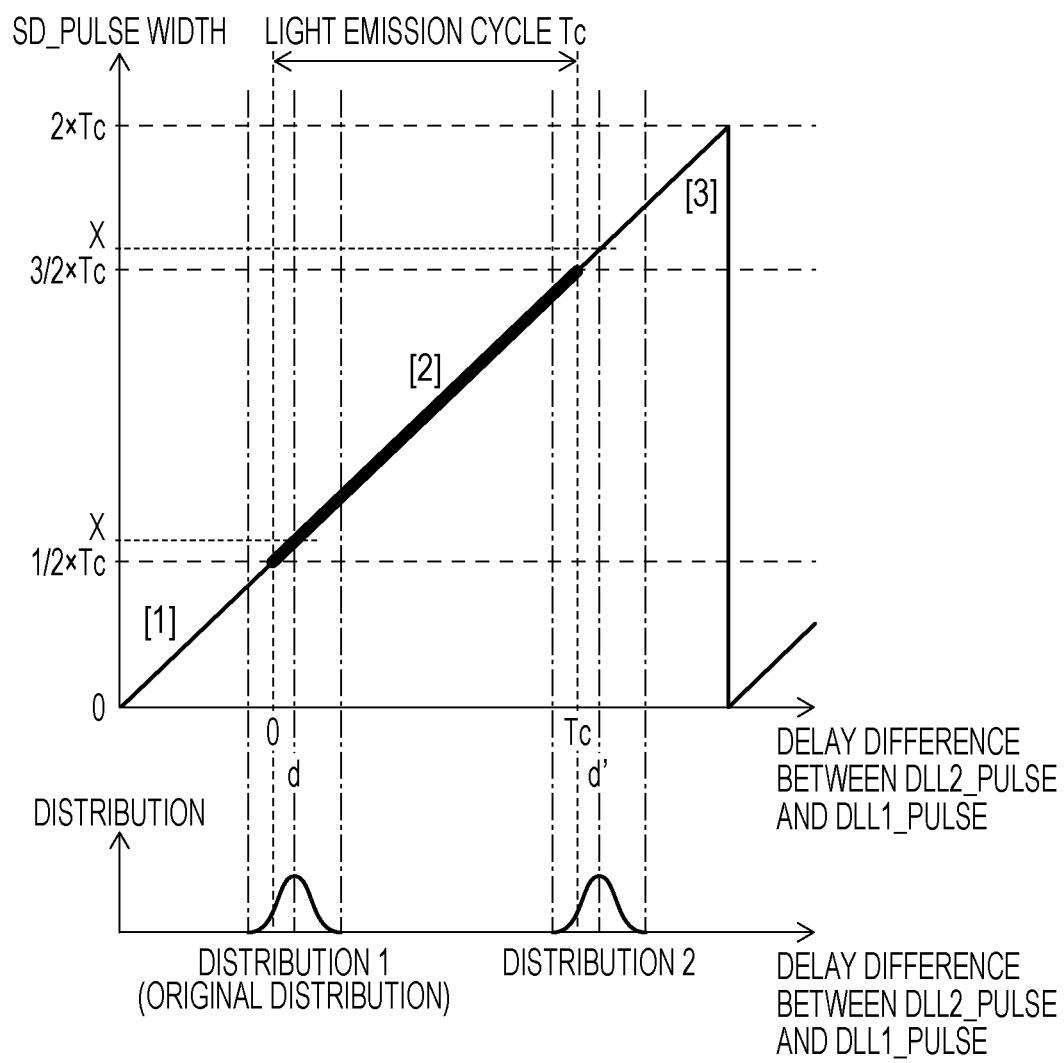
FIG. 13 is a graph illustrating characteristics of an output with respect to a DLL delay difference of the time difference extraction circuit illustrated in FIG. 3.

FIG. 13 illustrates characteristics of the SD_PULSE in a case where the time difference d corresponding to the delay difference between the signal DLL2_PULSE and the signal DLL1_PULSE is near 0 and a part where the time difference d is 0 or less in the distribution of an average value occurs when the signal DLL1_PULSE2 is generated first time (an output value of the averaging circuit is larger than a sum of a digitized value of the first cycle and a digitized value of a time O1). Since the signal DLL1_PULSE2 is delayed in the first generation, generation of the signal DLL1_PULSE2 to be originally generated is delayed by the light emission cycle Tc, so that a delay of distribution 1 is in a state of the SD_PULSE width as in distribution 2. Thus, an average value of the SD_PULSE width is also a value to which a digitized value of the light emission cycle Tc is added. It is obvious that an actual normal range of the delay difference is limited to a range of [2] in the range of the light emission cycle Tc because the signal DLL1_PULSE and the signal DLL2_PULSE have the same cycle as that of the light emission cycle Tc, and therefore, it is found that, in a case where the average value of the SD_PULSE width is in [3] that is a region exceeding the range of [2], the part where the time difference d is 0 or less in the distribution occurs in the first generation, so that it is possible to perform conversion into a normal SD_PULSE width (time X) by the following calculation.

$$X=X'-Tc$$

(where, X' is a value corresponding to the SD_AVE and Tc is a digitized value of the light emission cycle Tc)

Figure 14:
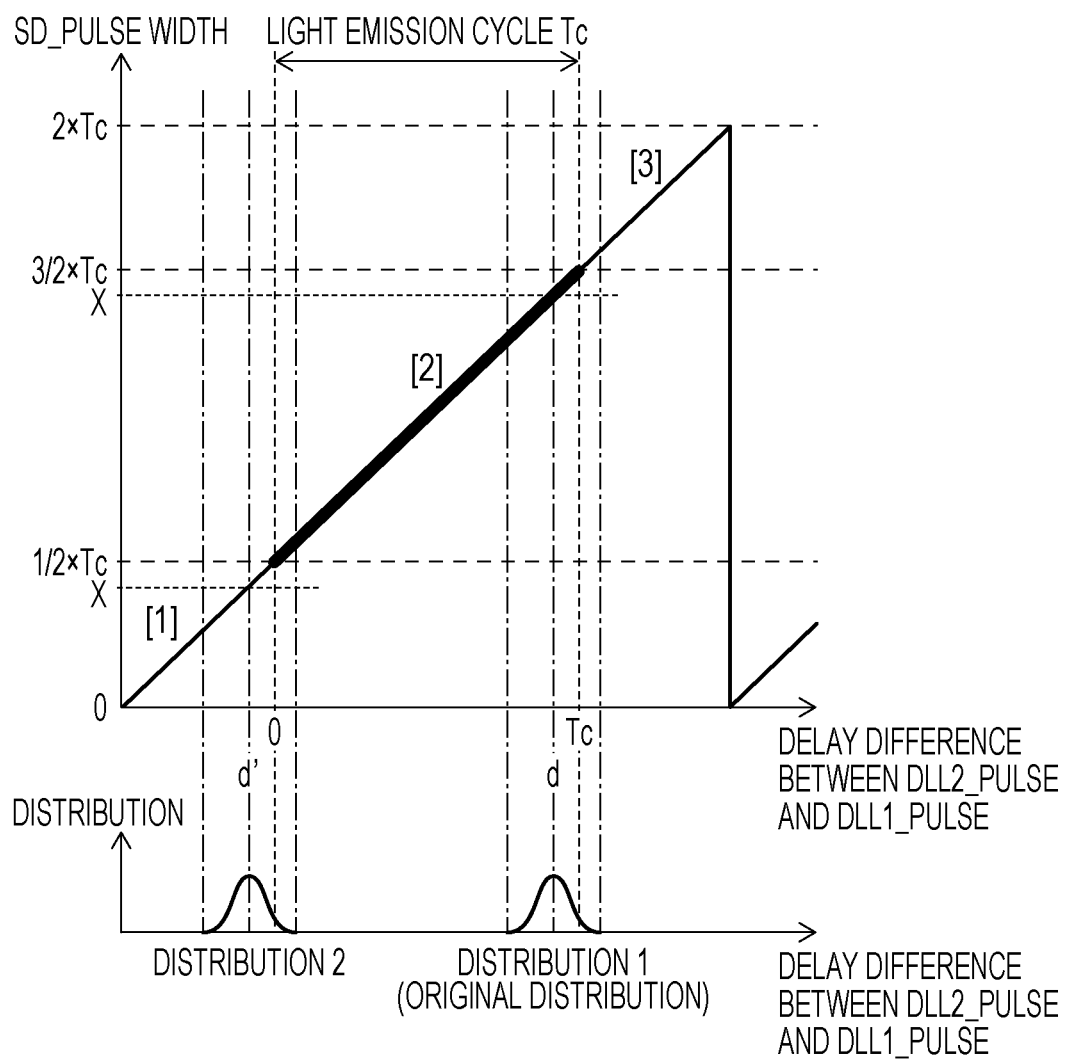
FIG. 14 is a graph illustrating characteristics of an output with respect to a DLL delay difference of the time difference extraction circuit illustrated in FIG. 3.

FIG. 14 illustrates characteristics of the SD_PULSE in a case where the time difference d corresponding to the delay difference between the signal DLL2_PULSE and the signal DLL1_PULSE is near a time Tc and a part where distribution of the time difference d is equal to or greater than the time Tc occurs when the signal DLL1_PULSE2 is generated second time (the output value of the averaging circuit is smaller than the digitized value of the time O1). Since the signal DLL1_PULSE2 is delayed in the first generation, the signal DLL1_PULSE2 is not originally generated near 0, but in a case where the time difference d exceeds the time Tc, the signal DLL1_PULSE2 is generated in a part where the time difference d exceeds the time 0 as a reference time, so that a delay of distribution 1 is in a state of the SD_PULSE width as in distribution 2. Thus, an average value of the SD_PULSE width is also a value obtained by subtracting the digitized value of the light emission cycle Tc. It is obvious that an actual normal range of the delay difference is limited to a range of [2] in the range of the light emission cycle Tc because the signal DLL1_PULSE and the signal DLL2_PULSE have the same cycle as that of the light emission cycle Tc, and therefore, it is found that, in a case where the average value of the SD_PULSE width is in [1] that is a region exceeding the range of [2], the part where the time difference d is equal to or greater than the time Tc in the distribution occurs in the second generation of the signal DLL1_PULSE2, so that it is possible to perform conversion into a normal SD_PULSE width (time X) by the following calculation.

$$X=X'+Tc$$

By performing the correction described above, a normal time difference d is able to be obtained even falling out of the range of [2]. The aforementioned configuration makes it possible to accurately determine whether an optical delay on the space optical path is within the light emission cycle without narrowing a range of the measurable distance in the light emission cycle Tc.

Note that, the signal DLL1_PULSE output by the first DLL 121 may be divided by three or more. The signal DLL2_PULSE output by the second DLL 122 may be divided by three or more as long as being divided by the same number as that of the signal DLL1_PULSE. In the time difference extraction circuit 19, a delay of ½ of the light emission cycle Tc is generated as the first time offset for the signal DLL1_PULSE, but there is no limitation thereto and a delay of m (m≥1) times of ½ of the light emission cycle Tc may be generated. Moreover, a delay (second time offset) other than the 0 cycle of the light emission cycle Tc may be further generated for the signal DLL2_PULSE or a delay other that the 0 cycle of the light emission cycle Tc may be generated for the signal DLL2_PULSE instead of the signal DLL1_PULSE. Note that, when a difference between the time corresponding to the first time offset and the time corresponding to the second time offset is O1, the time O1 needs to satisfy at least relations of $$O1=m \cdot T\tfrac{1}{2}$$

(where, m≥1)

$$0<O1<(N-1) \cdot T1$$

(where N is a division number of the signal DLL1_PULSE and the signal DLL2_PULSE).

It is possible to recognize that the optical sensor 101 has the following configuration.

The optical sensor 101 includes at least the light emitting element 18 that is driven in the first cycle T1 (that is, light emission cycle Tc), the first light receiving unit 11 of a photon-count type that outputs a pulse for incidence of signal light (that is, reflection light from the detection object S) to be measured, the second light receiving unit 12 of a photon-count type that outputs a pulse for incidence of reference light (that is, direct light from the light emitting element 18) indicating a time reference, and the time difference extraction circuit 19 that extracts a time difference between an output of the first light receiving unit 11 and an output of the second light receiving unit 12. The time difference extraction circuit 19 includes the first DLL 121 that inputs the output from the first light receiving unit 11, the second DLL 122 that inputs the output from the second light receiving unit 12, the DFF 1 that divides the output (that is, signal DLL1_PULSE) of the first DLL 121 by N (that is, by two) to provide the first time offset (delay corresponding to ½ of the light emission cycle Tc), the DFF 2 that divides the output (that is, signal DLL2_PULSE) of the second DLL 122 by N (that is, by two) to provide the second time offset (delay corresponding to the 0 cycle of the light emission cycle Tc), the pulse width averaging circuit 24 that averages an output time difference (that is, SD_PULSE) of the DFF 1 and the DFF 2, and the extraction unit (not illustrated) that corrects an output (that is, SD_AVE) of the pulse width averaging circuit 24 on the basis of the first time offset and the second time offset and extracts a value (that is, RANGE) corresponding to the output time difference. The time O1 obtained by subtracting the second time offset from the first time offset satisfies at least relations of O1=m·T½ (m≥1) and 0<O1<(N−1)·T1.

In the optical sensor 101, the extraction unit subtracts a digitized value of a difference (that is, time O1) between the first time offset and the second time offset from a value of the output of the pulse width averaging circuit 24.

In the optical sensor 101, an output (that is, signal DLL1_PULSE2) of the DFF 1 is not generated until at least the time O1 has lapsed after a time when an output (that is, signal DLL2_PULSE2) of the DFF 2 is generated first.

A state where the second time offset is a delay corresponding to the 0 cycle of the light emission cycle Tc may mean that the second time offset does not exist. In this manner, only either the first time offset or the second time offset may be set.

In the optical sensor 101, in a case where a value of the output (that is, SD_AVE) of the pulse width averaging circuit 24 is smaller than the digitized value of the difference between the first time offset and the second time offset, the time difference extraction circuit 19 adds a digitized value of the first cycle T1 to the value of the output of the pulse width averaging circuit 24, and in a case where the value of the output is larger than a sum of the digitized value of the difference and the digitized value of the first cycle T1, the time difference extraction circuit 19 subtracts the digitized value of the first cycle T1 from the value of the output of the pulse width averaging circuit 24.

Embodiment 2

Figure 12:
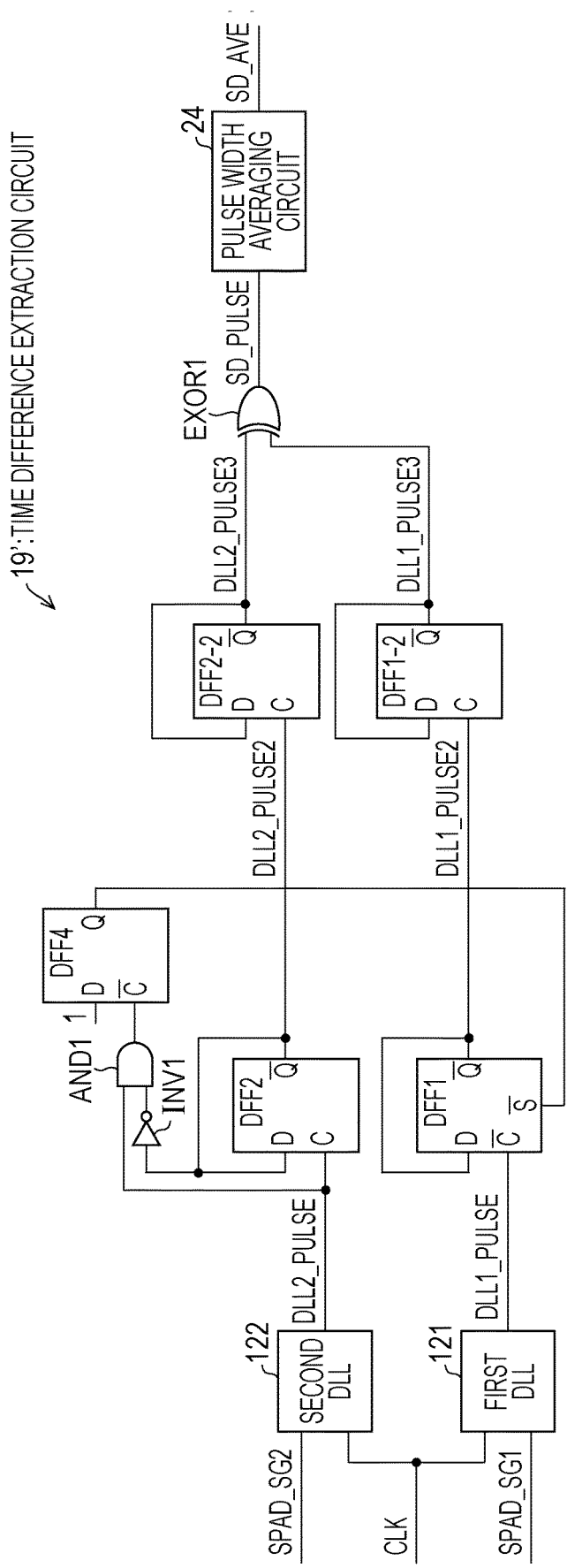
FIG. 12 is a block diagram of a time difference extraction circuit according to Embodiment 2 of the invention.

FIG. 12 is a block diagram of a time difference extraction circuit 19' according to Embodiment 2 of the invention. In the optical sensor 101 indicated in Embodiment 1, the time difference extraction circuit 19' illustrated in FIG. 12 may be used instead of the time difference extraction circuit 19.

The signal DLL1_PULSE2 and the signal DLL2_PULSE2 that are created in the time difference extraction circuit 19 are respectively caused to further pass through a DFF 1-2 and a DFF 2-2. Thereby, a signal DLL1_PULSE3 and a signal DLL2_PULSE3 respectively obtained by dividing the signal DLL1_PULSE and the signal DLL2_PULSE by four (by 2·N) are created. By passing the signal DLL1_PULSES and the signal DLL2_PULSE3 through an EXOR (exclusive OR) circuit EXOR1, the SD_PULSE is created.

Figure 15:
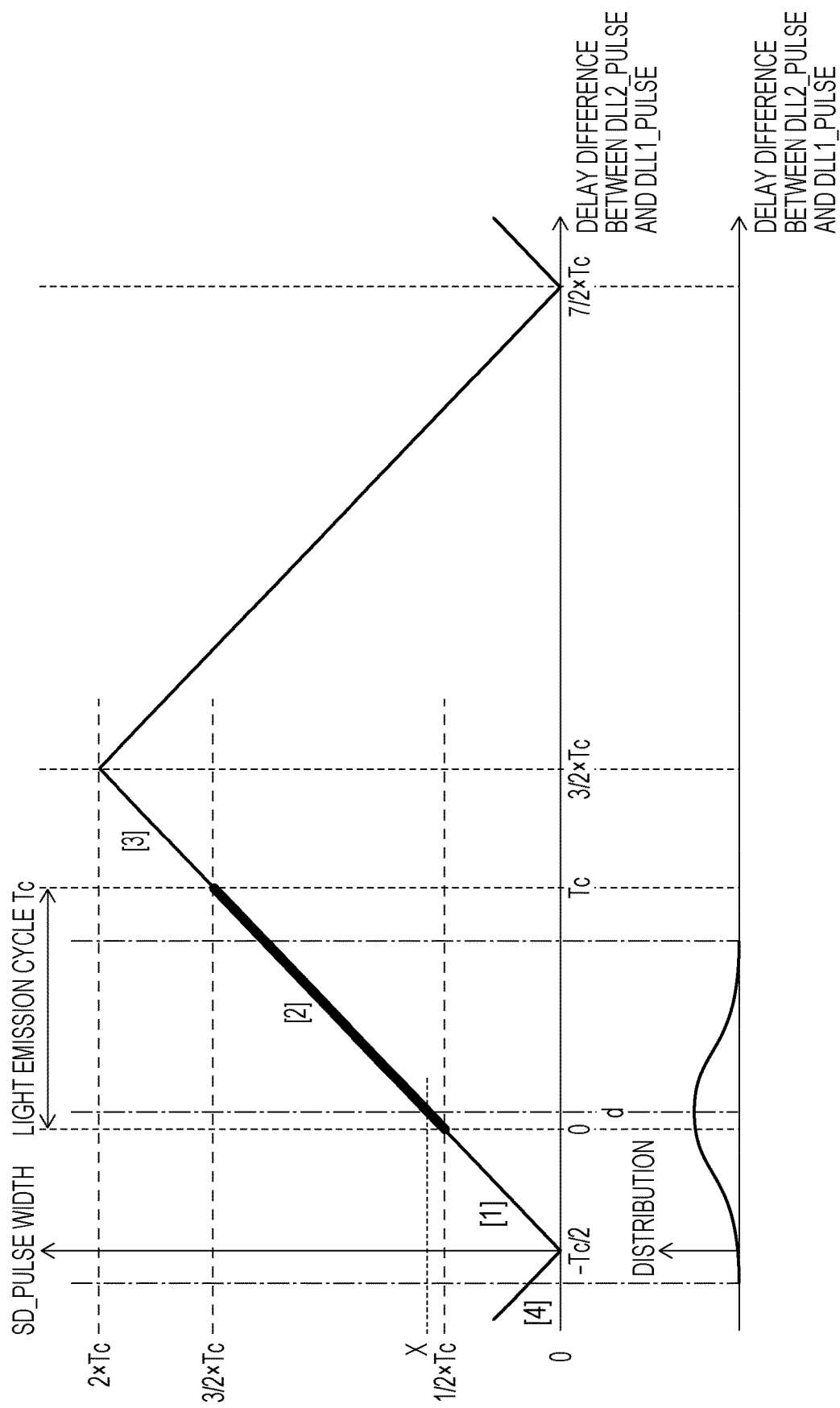
FIG. 15 is a graph illustrating characteristics of an output with respect to a DLL delay difference of the time difference extraction circuit illustrated in FIG. 12.

FIG. 15 illustrates characteristics of an SD_PULSE width for a delay difference between the signal DLL1_PULSE and the signal DLL2_PULSE in the time difference extraction circuit 19'. In a case of the characteristics, there is less change in the characteristics when exceeding two-division of the light emission cycle Tc, so that averaging is able to be performed with less error even in a case of distribution with a wide delay difference as illustrated in FIG. 15 and it is possible to extract the RANGE with less error from the SD_AVE.

The time difference extraction circuit 19' includes the DFF 1 and the DFF 1-2 that divide an output of the first DLL 121 by 2·N (N≥2) to provide the first time offset, the DFF 2 and the DFF 2-2 that divide an output of the second DLL 122 by 2·N (N≥2) to provide the second time offset, the pulse width averaging circuit 24 that performs averaging with a pulse width, which is obtained by EXOR of an output of the DFF 1-2 and an output of the DFF 2-2, as a time difference, and the extraction unit that corrects the output of the pulse width averaging circuit 24 on the basis of the first time offset and the second time offset and extracts a value corresponding to the output time difference.

Embodiment 3

Figure 16:
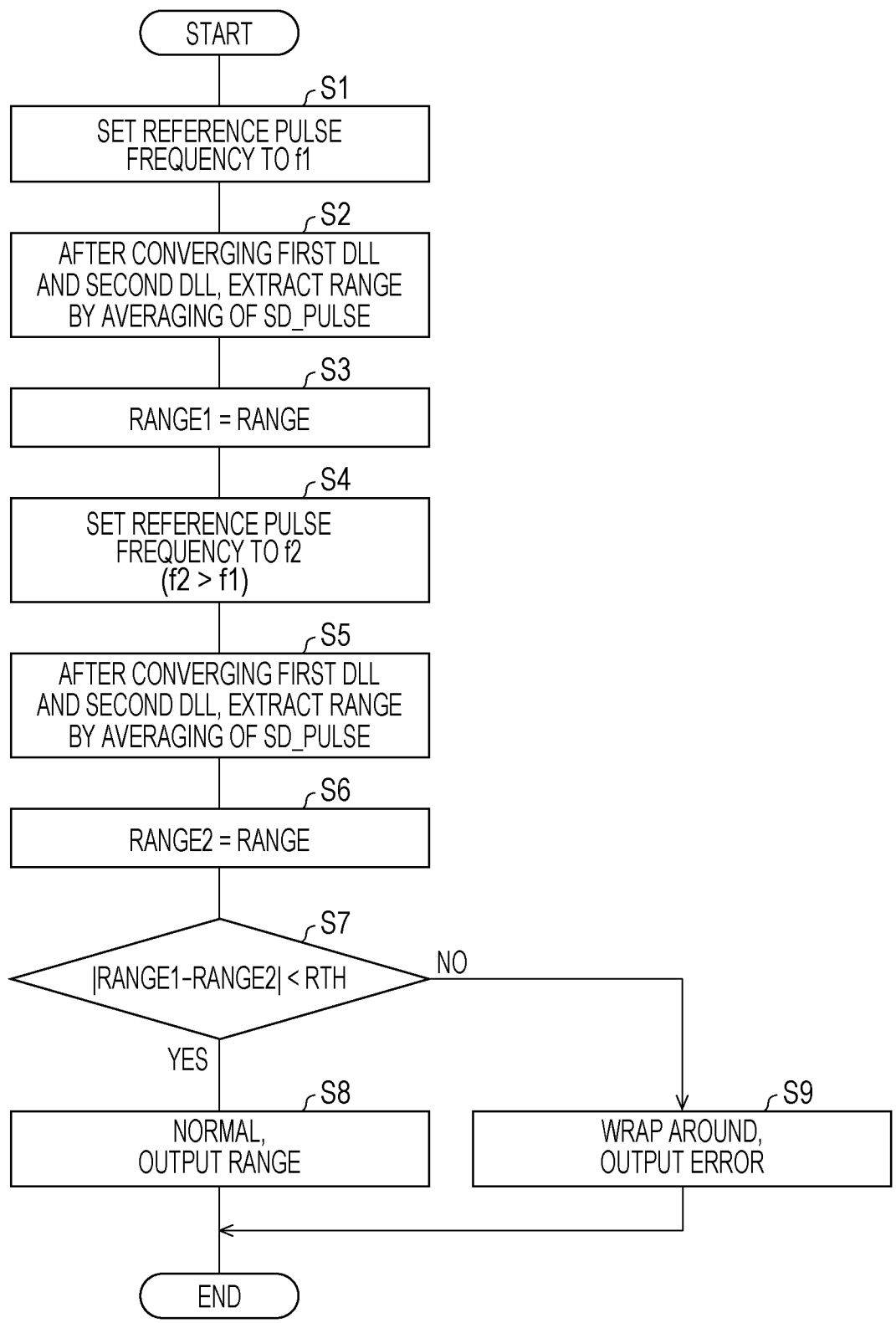
FIG. 16 is a flowchart for determination of Wrap Around according to Embodiment 3 of the invention.

When the time difference extraction circuit 19 or the time difference extraction circuit 19' is used in the optical sensor 101 indicated in Embodiment 1, in a flowchart illustrated in FIG. 16, it is possible to determine whether an optical delay on the space optical path is in a Wrap Around state and perform error determination. The Wrap Around state means a state where the optical delay on the space optical path exceeds the light emission cycle Tc.

First, a reference clock CLK synchronized with the light emission cycle Tc of the light emitting element 18 is set to f1 (step S1), a RANGE is extracted (step S2), and a value of the extracted RANGE is saved in a RANGE 1 (step S3). Next, the reference clock CLK synchronized with the light emission cycle Tc of the light emitting element 18 is set to f2 (here, f2>f1) (step S4), a RANGE is extracted (step S5) and saved in a RANGE 2 (step S6). Comparison of |RANGE 1−RANGE 2| to an appropriate threshold RTH is performed (step S7), and when |RANGE 1−RANGE 2| is smaller than the threshold RTH (YES is given as a result of step S7), it is determined that an optical delay on the space optical path is within the light emission cycle Tc and the RANGE is output (step S8), and when |RANGE 1−RANGE 2| is larger than the threshold RTH or |RANGE 1−RANGE 2| and the threshold RTH are the same (NO is given as a result of step S7), the optical delay is in a region where a difference is caused due to a difference of the light emission cycle Tc and it is possible to determine that the state is in the Wrap Around state (step S9).

Figure 6:
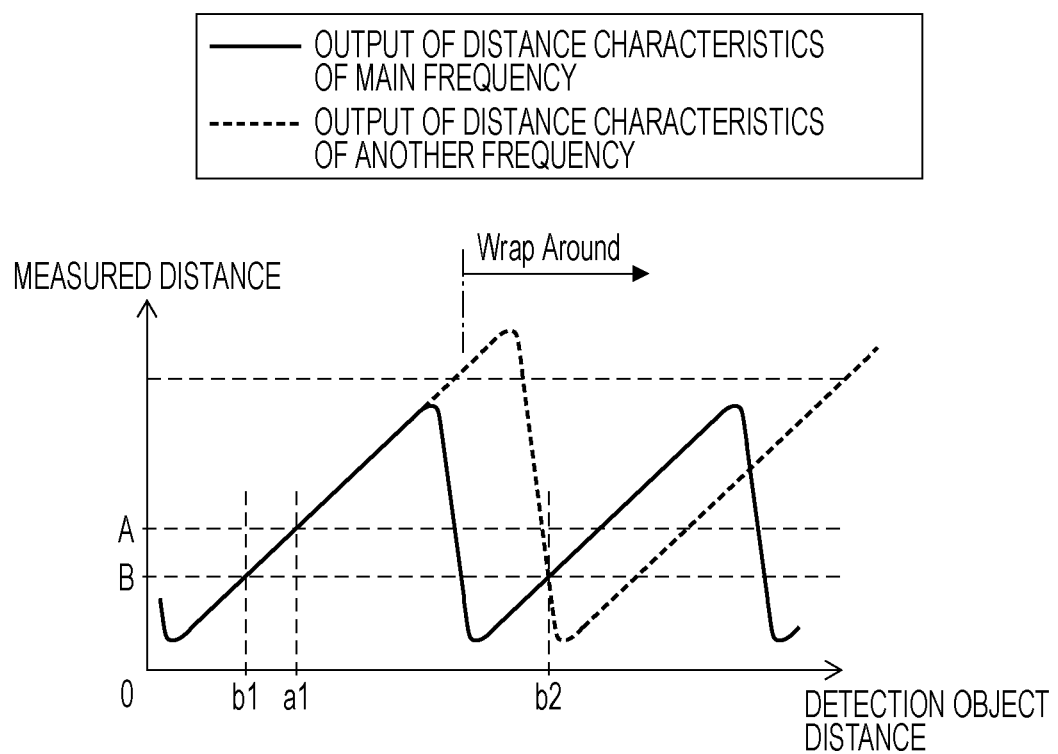
FIG. 6 is a graph illustrating characteristics of a relationship between a detection object distance and a measured distance when measurement is performed in two cycles according to a related art.
Figure 17:
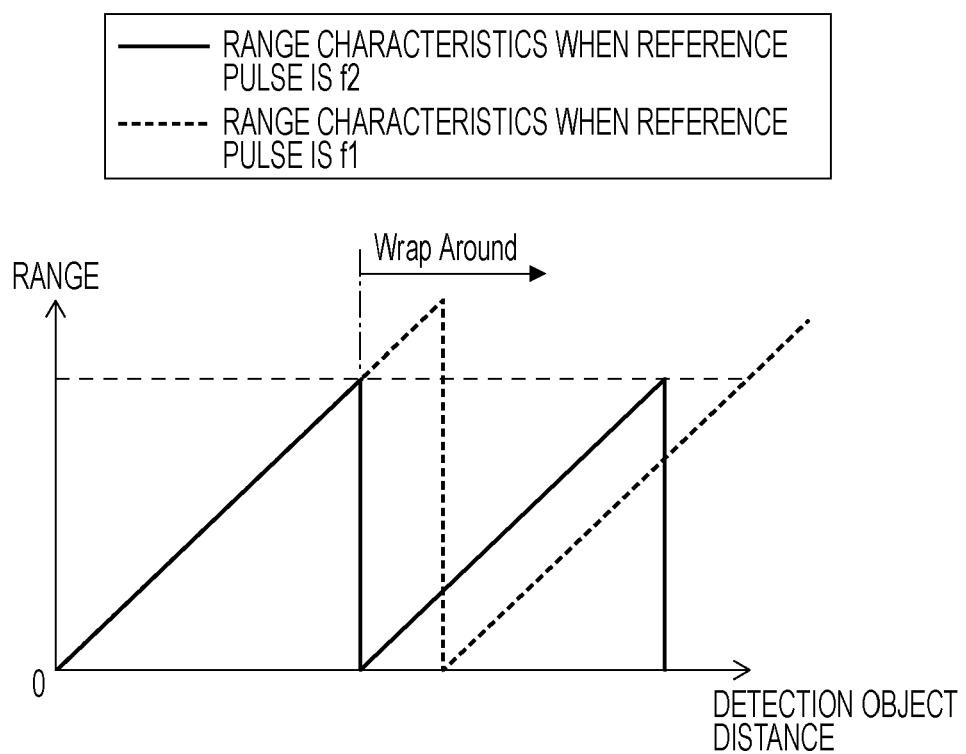
FIG. 17 is a graph illustrating characteristics of a relationship between a detection object distance and RANGE when measurement is performed in two cycles according to Embodiment 3.

In a case where division of the signal DLL1_PULSE or the signal DLL2_PULSE is not performed, there is a part where determination of the Wrap Around is not able to be performed as in a case of RANGE=B of FIG. 6 described above, however, according to the time difference extraction circuit 19 or the time difference extraction circuit 19', no median value exists when the cycle is switched as in FIG. 17, so that a difference between the RANGE 1 and the RANGE 2 is able to be accurately measured and it is possible to accurately determine whether the optical delay on the space optical path is within the light emission cycle Tc.

That is, the first cycle T1 is able to be switched to the second cycle T2, and in a case where there is a fixed difference or more in output values of the extraction unit, which are measured in the respective cycles, it is determined that a time till when light output from the light emitting element 18 is reflected by the detection object S and incident on the first light receiving unit 11 exceeds the first cycle T1 or the second cycle T2.

Embodiment 4

Each of the optical sensors according to Embodiments 1 to 3 described above may be incorporated in an electronic device. Specific examples of such an electronic device include a camera, a robot cleaner, and a smartphone.

Conclusion

An optical sensor according to an aspect 1 of the invention includes at least: a light emitting element that is driven in a first cycle; a first light receiving unit of a photon-count type that outputs a pulse according to incidence of signal light (reflection light from the detection object S) to be measured; a second light receiving unit of a photon-count type that outputs a pulse according to incidence of reference light (direct light from the light emitting element 18) indicating a time reference; and a time difference extraction circuit that extracts a time difference between the output pulse from the first light receiving unit and the output pulse from the second light receiving unit, in which the time difference extraction circuit includes a first DLL to which the output pulse from the first light receiving unit is input, a second DLL to which the output pulse from the second light receiving unit is input, a first waveform generation unit (DFF 1) that divides the output pulse of the first DLL by N (N≥2) to provide a first time offset, and a second waveform generation unit (DFF 2) that divides the output pulse of the second DLL by N to provide a second time offset, and at least following mathematical formulas (1) and (2) are satisfied:

$$O1 = m \cdot T\frac{1}{2} \quad (1)$$

$$0 < O1 < (N-1) \cdot T1 \quad (2)$$

(where, m≥1),
when a time corresponding to a difference between the first time offset and the second time offset is O1 and the first cycle is T1.

An optical sensor according to an aspect 4 of the invention includes at least: a light emitting element that is driven in a first cycle; a first light receiving unit of a photon-count type that outputs a pulse according to incidence of signal light to be measured; a second light receiving unit of a photon-count type that outputs a pulse according to incidence of reference light indicating a time reference; and a time difference extraction circuit that extracts a time difference between the output pulse from the first light receiving unit and the output pulse from the second light receiving unit, in which the time difference extraction circuit includes a first DLL to which the output pulse from the first light receiving unit is input, a second DLL to which the output pulse from the second light receiving unit is input, a first waveform generation unit that divides the output pulse of the first DLL by N (N≥2), and a second waveform generation unit that divides the output pulse of the second DLL by N, the first waveform generation unit provides a time offset to the output pulse of the first DLL or the second waveform generation unit provides a time offset to the output pulse of the second DLL, and at least following mathematical formulas (1) and (2) are satisfied:

$$O1 = m \cdot T\frac{1}{2} \quad (1)$$

$$0 < O1 < (N-1) \cdot T1 \quad (2)$$

(where, m≥1),
when a time corresponding to the time offset is O1 and the first cycle is T1.

According to each of the configurations described above, in a case where jitter is generated in a signal indicating the time difference between the output pulse from the first light receiving unit and the output pulse from the second light receiving unit, the time difference is able to be corrected. Thus, whether an optical delay on a space optical path within a light emission cycle is able to be accurately determined without narrowing a range of a measurable distance in the light emission cycle.

According to an optical sensor according to an aspect 2 of the invention, in the aspect 1, the time difference extraction circuit may include an averaging circuit (pulse width averaging circuit 24) that averages an output time difference of the first waveform generation unit and the second waveform generation unit and outputs a digitized value of the resultant, and an extraction unit that corrects an output value of the averaging circuit on a basis of the first time offset and the second time offset and extracts a digitized value of a time difference between the output pulse from the first light receiving unit and the output pulse from the second light receiving unit, and the extraction unit may subtract a digitized value of the time O1 from the output value of the averaging circuit.

According to an optical sensor according to an aspect 3 of the invention, in the aspect 1 or 2, timing when an output of the first waveform generation unit is generated may be delayed from timing when an output of the second waveform generation unit is generated by the time O1 or more.

According to an optical sensor according to an aspect 5 of the invention, in any of the aspects 1 to 3, the first waveform generation unit may divide the output pulse of the first DLL by 2·N, the second waveform generation unit may divide the output pulse of the second DLL by 2·N, and the time difference extraction circuit may have an EXOR circuit that outputs an exclusive OR of the output of the first waveform generation unit and the output of the second waveform generation unit.

According to an optical sensor according to an aspect 6 of the invention, in any of the aspects 1 to 5, the time difference extraction circuit may have an averaging circuit that averages the output time difference of the first waveform generation unit and the second waveform generation unit and outputs a digitized value of the resultant, and in a case where an output value of the averaging circuit is smaller than the digitized value of the time O1, a digitized value of the first cycle may be added to the output value of the averaging circuit, and in a case where the output value of the averaging circuit is larger than a sum of the digitized value of the time O1 and the digitized value of the first cycle, the digitized value of the first cycle may be subtracted from the output value of the averaging circuit.

According to each of the configurations described above, the time difference extraction circuit is able to be implemented.

According to an optical sensor according to an aspect 7 of the invention, in the aspect 1, the time difference extraction circuit may include an averaging circuit that averages as output time difference of the first waveform generation unit and the second waveform generation unit and outputs a digitized value of the resultant, and an extraction unit that corrects an output value of the averaging circuit on a basis of the first time offset and the second time offset and extracts a digitized value of a time difference between the output pulse from the first light receiving unit and the output pulse from the second light receiving unit, and the light emitting element may further emit light in a second cycle that is different from the first cycle, and in a case where there is a fixed difference or more between a value extracted by the extraction unit when the light emitting element emits light in the first cycle and a value extracted by the extraction unit when the light emitting element emits light in the second cycle, it may be determined that a time from light emission of the light emitting element to reception of the light by the first light receiving unit exceeds at least one of the first cycle and the second cycle.

According to the configuration described above, it is possible to determine whether the optical sensor is in a Wrap Around state and perform error determination.

An electronic device according to an aspect 8 of the invention includes the optical sensor of any of the aspects 1 to 7.

According to the configuration described above, the electronic device including the optical sensor according to any of the aspects of the invention is able to be implemented.

The invention is not limited to each of the embodiments described above, and may be modified in various manners within the scope indicated in the claims and an embodiment achieved by appropriately combining technical means disclosed in each of different embodiments is also encompassed in the technical scope of the invention. Further, by combining the technical means disclosed in each of the embodiments, a new technical feature may be formed.

REFERENCE SIGNS LIST

11 first light receiving unit
12 second light receiving unit
18 light emitting element
19, 19' time difference extraction circuit
24 pulse width averaging circuit (averaging circuit)
101 optical sensor
121 first DLL
122 second DLL
DFF 1, DFF 1-2 DFF (first waveform generation unit)
DFF 2, DFF 2-2 DFF (second waveform generation unit)
EXOR1 EXOR circuit

The invention claimed is:
1. An optical sensor comprising at least:
a light emitting element that is driven in a first cycle;
a first light receiving unit of a photon-count type that outputs a pulse according to incidence of signal light to be measured;
a second light receiving unit of a photon-count type that outputs a pulse according to incidence of reference light indicating a time reference; and
a time difference extraction circuit that extracts a time difference between the output pulse from the first light receiving unit and the output pulse from the second light receiving unit, wherein
the time difference extraction circuit includes
a first DLL to which the output pulse from the first light receiving unit is input,
a second DLL to which the output pulse from the second light receiving unit is input,
a first waveform generation unit that divides the output pulse of the first DLL by N (N≥2) to provide a first time offset, and
a second waveform generation unit that divides the output pulse of the second DLL by N to provide a second time offset, and
at least following mathematical formulas (1) and (2) are satisfied:

$$O1 = m \cdot T\tfrac{1}{2} \tag{1}$$

$$0 < O1 < (N-1) \cdot T1 \tag{2}$$

(where, m≤1),
when a time corresponding to a difference between the first time offset and the second time offset is O1 and the first cycle is T1.

2. The optical sensor according to claim 1, wherein
the time difference extraction circuit includes
an averaging circuit that averages an output time difference of the first waveform generation unit and the second waveform generation unit and outputs a digitized value of the resultant, and
an extraction unit that corrects an output value of the averaging circuit on a basis of the first time offset and the second time offset and extracts a digitized value of a time difference between the output pulse from the first light receiving unit and the output pulse from the second light receiving unit, and
the extraction unit subtracts a digitized value of the time O1 from the output value of the averaging circuit.

3. The optical sensor according to claim 1, wherein
timing when an output of the first waveform generation unit is generated is delayed from timing when an output of the second waveform generation unit is generated by the time O1 or more.

4. The optical sensor according to claim 1, wherein
the first waveform generation unit divides the output pulse of the first DLL by 2·N,
the second waveform generation unit divides the output pulse of the second DLL by 2·N, and
the time difference extraction circuit has an EXOR circuit that outputs an exclusive OR of the output of the first waveform generation unit and the output of the second waveform generation unit.

5. The optical sensor according to claim 1, wherein
the time difference extraction circuit has
an averaging circuit that averages the output time difference of the first waveform generation unit and the second waveform generation unit and outputs a digitized value of the resultant, and
in a case where an output value of the averaging circuit is smaller than the digitized value of the time O1, a digitized value of the first cycle is added to the output value of the averaging circuit, and
in a case where the output value of the averaging circuit is larger than a sum of the digitized value of the time O1 and the digitized value of the first cycle, the digitized value of the first cycle is subtracted from the output value of the averaging circuit.

6. The optical sensor according to claim 1, wherein
the time difference extraction circuit includes
an averaging circuit that averages an output time difference of the first waveform generation unit and the second waveform generation unit and outputs a digitized value of the resultant, and
an extraction unit that corrects an output value of the averaging circuit on a basis of the first time offset and the second time offset and extracts a digitized value of a time difference between the output pulse from the first light receiving unit and the output pulse from the second light receiving unit, and
the light emitting element further emits light in a second cycle that is different from the first cycle, and
in a case where there is a fixed difference or more between a value extracted by the extraction unit when the light emitting element emits light in the first cycle and a value extracted by the extraction unit when the light emitting element emits light in the second cycle, it is determined that a time from light emission of the light emitting element to reception of the light by the first light receiving unit exceeds at least one of the first cycle and the second cycle.

7. An electronic device comprising the optical sensor according to claim 1.

8. An optical sensor comprising at least:
a light emitting element that is driven in a first cycle;
a first light receiving unit of a photon-count type that outputs a pulse according to incidence of signal light to be measured;
a second light receiving unit of a photon-count type that outputs a pulse according to incidence of reference light indicating a time reference; and
a time difference extraction circuit that extracts a time difference between the output pulse from the first light receiving unit and the output pulse from the second light receiving unit, wherein
the time difference extraction circuit includes
a first DLL to which the output pulse from the first light receiving unit is input,
a second DLL to which the output pulse from the second light receiving unit is input,
a first waveform generation unit that divides the output pulse of the first DLL by N (N≥2), and
a second waveform generation unit that divides the output pulse of the second DLL by N,
the first waveform generation unit provides a time offset to the output pulse of the first DLL or the second waveform generation unit provides a time offset to the output pulse of the second DLL, and
at least following mathematical formulas (1) and (2) are satisfied:

$$O1 = m \cdot T \frac{1}{2} \qquad (1)$$

$$0 < O1 < (N-1) \cdot T1 \qquad (2)$$

(where, m≥1),
when a time corresponding to the time offset is O1 and the first cycle is T1.

9. The optical sensor according to claim 8, wherein
the time difference extraction circuit has
an averaging circuit that averages the output time difference of the first waveform generation unit and the second waveform generation unit and outputs a digitized value of the resultant, and
in a case where an output value of the averaging circuit is smaller than the digitized value of the time O1, a digitized value of the first cycle is added to the output value of the averaging circuit, and
in a case where the output value of the averaging circuit is larger than a sum of the digitized value of the time O1 and the digitized value of the first cycle, the digitized value of the first cycle is subtracted from the output value of the averaging circuit.

10. An electronic device comprising the optical sensor according to claim 8.

* * * * *